(12) United States Patent
Neji et al.

(10) Patent No.: US 10,126,390 B2
(45) Date of Patent: Nov. 13, 2018

(54) MAGNETIC RESONANCE SPECTROSCOPY WITH PHASE ROTATION

(71) Applicant: Siemens Aktiengesellschaft, Munich (DE)

(72) Inventors: Radhouene Neji, London (GB); Christian Schuster, Langenzenn (DE)

(73) Assignee: Siemens Aktiengesellschaft, Munich (DE)

( * ) Notice: Subject to any disclaimer, the term of this patent is extended or adjusted under 35 U.S.C. 154(b) by 933 days.

(21) Appl. No.: 14/630,973

(22) Filed: Feb. 25, 2015

(65) Prior Publication Data

US 2015/0241532 A1 Aug. 27, 2015

(30) Foreign Application Priority Data

Feb. 26, 2014 (DE) .................. 10 2014 203 432

(51) Int. Cl.
*G01R 33/46* (2006.01)
*G01R 33/385* (2006.01)
(Continued)

(52) U.S. Cl.
CPC ....... *G01R 33/4616* (2013.01); *G01R 33/385* (2013.01); *G01R 33/485* (2013.01);
(Continued)

(58) Field of Classification Search
CPC .............. G01R 33/4616; G01R 33/385; G01R 33/4828; G01R 33/4831; G01R 33/485; G01R 33/565
See application file for complete search history.

(56) References Cited

U.S. PATENT DOCUMENTS 4,318,043 A * 3/1982 Crooks .................. G01R 33/54
324/309
5,099,207 A 3/1992 Luyten
(Continued)

FOREIGN PATENT DOCUMENTS

EP 0 347 990 A1 12/1989

OTHER PUBLICATIONS

Boer, "Magnetic Resonance Spectroscopy at ultra-high field in humans: it proposes only an ad-hac 16-step phase cycling for the semi-laser SVS sequence," ISBN: 978-90-393-5706-4, pp. 1-146.
(Continued)

*Primary Examiner* — Dixomara Vargas
(74) *Attorney, Agent, or Firm* — Schiff Hardin LLP

(57) ABSTRACT

In a method and magnetic resonance (MR) apparatus for acquiring an MR signal from an examination subject according to a pulse sequence, a first radio-frequency pulse is applied with a first phase and a gradient field is simultaneously applied in a first direction. Second and third radio-frequency pulses, with second and third phases, respectively, are applied simultaneously with a gradient field in a second direction. A fourth and a fifth radio-frequency pulse, with a fourth and a fifth phase, respectively, are applied and simultaneously with a gradient field in a third direction. A signal with a receiver phase is acquired =. The pulse sequence is repeated a number of times under phase rotation, wherein the third and fourth radio-frequency pulses in each repetition have the same phase, and the signals acquired in the repetition are added.

13 Claims, 4 Drawing Sheets

(51) Int. Cl.
*G01R 33/48* (2006.01)
*G01R 33/483* (2006.01)
*G01R 33/485* (2006.01)
*G01R 33/565* (2006.01)

(52) U.S. Cl.
CPC ..... *G01R 33/4828* (2013.01); *G01R 33/4831* (2013.01); *G01R 33/565* (2013.01)

(56) References Cited

U.S. PATENT DOCUMENTS

| | | | | |
|---|---|---|---|---|
| 5,363,036 | A * | 11/1994 | Mansfield | F02G 1/0445 |
| | | | | 324/307 |
| 5,548,216 | A * | 8/1996 | Dumoulin | G01R 33/4835 |
| | | | | 324/306 |
| 6,678,544 | B2 * | 1/2004 | Butts | G01R 33/285 |
| | | | | 324/307 |
| 7,403,006 | B2 * | 7/2008 | Garwood | G01R 33/54 |
| | | | | 324/307 |
| 7,425,828 | B2 * | 9/2008 | Garwood | G01N 24/10 |
| | | | | 324/310 |
| 7,777,484 | B2 * | 8/2010 | Garwood | G01N 24/10 |
| | | | | 324/307 |
| 8,067,936 | B2 * | 11/2011 | Garwood | G01N 24/10 |
| | | | | 324/307 |
| 8,148,982 | B2 * | 4/2012 | Witschey | G01R 33/5614 |
| | | | | 324/307 |
| 8,217,653 | B2 * | 7/2012 | Vaughan | G01R 33/3415 |
| | | | | 324/307 |

OTHER PUBLICATIONS

Sison et al. "Extension of 8 Step Phase Cycling Scheme for improved lipid suppression using four-pulse PRESS MRS Sequences," Proc. Intl.Soc. Mag.Reson.Med 15, p. 1353; (2007).

Hennig, The Application of Phase Rotation for Localized in Vivo Proton Spectroscopy with Short Echo Times, Journal of Magnetic Resonance 96, pp. 40-49; (1992).

Starck et al."K-Space analysis of point-resolved spectroscopy (PRESS) with regard to spurious echoes in in vivo 1H MRS"; NMR Biomed; vol. 22; pp. 137-147; (2009).

Zur et al: "A Phase-Cycling Technique for Canceling Spurious Echoes in NMR Imaging"; in: Journal of Magnetic Resonance; vol. 71; pp. 212-228; 1987.

* cited by examiner

MAGNETIC RESONANCE SPECTROSCOPY WITH PHASE ROTATION

BACKGROUND OF THE INVENTION

Field of the Invention

The invention relates to a method for acquiring a magnetic resonance signal from an examination subject according to a pulse sequence, in particular a voxel-selective spectroscopy sequence, in which a phase rotation is used. This means that the sequence is repeated a number of times with respectively different phases of the radio-frequency pulses and the signals acquired in the process are added together.

Description of the Prior Art

Phase rotation is generally known in magnetic resonance (MR) and in particular in magnetic resonance spectroscopy. In the simplest spectroscopy data acquisition consisting of 90° excitation pulse followed by acquisition of the FID (Free Induction Decay), the phase of the excitation pulse can be incremented by 90° for example in each acquisition; at the same time the receiver phase is also incremented by 90° in each case. Since in this way the phase difference between the receiver and the magnetization of the FID remains constant in each case, each step in the phase rotation cycle produces the same lineshape of the resonance, with the result that the wanted signal is amplified during the summation, whereas other influences such as phase shifts due to amplifiers and filters cancel one another out.

In voxel-selective MR spectroscopy (Single Voxel Spectroscopy (SVS)), phase rotation is furthermore used in order to suppress unwanted coherences and interfering echoes ("spurious echoes"). These are produced, for example, due to the fact that the respective slice-selective excitation pulses in SVS do not excite the spins within the selected slice exclusively, but also act, albeit at a very much lower flip angle, on the spins outside of the voxel. In actual fact, the echoes generated thereby from outside of the selected voxel have a very much lower signal strength than the desired echo from the selected voxel. However, because the selected voxel usually has a very much smaller volume (e.g. 1 to 8 cm$^3$) than the surrounding tissue, which contributes toward the unwanted echoes (e.g. the whole of the remainder of the skull), the unwanted echoes and coherences in the acquired signal also still possess a high signal strength nonetheless.

A phase rotation scheme for the PRESS (Point Resolved Spectroscopy) sequence was presented by J. Hennig in the Journal of Magnetic Resonance, 96, 40-49 (1992). The Press sequence consists of a slice-selective 90° pulse, followed by two 180° pulses, which are in each case emitted while a gradient field is applied in the two other spatial directions and lead to a voxel-selective spin echo. Minor inaccuracies in the phase of the radio-frequency (RF) pulses or their amplitude, which can apply in particular also to the volume outside of the selected voxel, lead to the outcome that not just the wanted echo is generated by means of the pulse sequence, but e.g. a spin echo is generated for each pair of pulses, and an FID for each pulse. These unwanted signals can be suppressed in part by means of spoiler gradients.

The phase rotation used by J. Hennig proceeds according to the following scheme:

| | Excitation pulse | | | | | | | |
|---|---|---|---|---|---|---|---|---|
| | 90° | 90° | 90° | 90° | 270° | 270° | 270° | 270° |
| 1st refocusing | 0° | 90° | 180° | 270° | 0° | 90° | 180° | 270° |
| 2nd refocusing | 90° | 180° | 270° | 0° | 0° | 90° | 180° | 270° |

This 8-step phase rotation is also referred to as 8-step EXOR.

Particularly in the case of high field strengths, it is often difficult to provide refocusing pulses having a sufficiently high bandwidth. For this reason, adiabatic refocusing pulses are frequently employed in such a situation. These are also referred to as AFP (Adiabatic Full Passage). The rapid adiabatic passage leads to a reversal of the spin orientation, which is less sensitive with respect to the magnetic field homogeneity. An adiabatic pulse is able to invert large bandwidths at low power. It is possible to replace the refocusing pulses in a PRESS sequence by adiabatic pulses. However, since each individual adiabatic 180° pulse having a slice-selective gradient generates a first-order phase variation across the spectrum, two successive adiabatic refocusing pulses are used in each case for each spatial direction. In LASER and semi-LASER spectroscopy, therefore, four adiabatic refocusing pulses are used instead of the two standard refocusing pulses in a normal PRESS sequence.

A phase rotation scheme for a semi-LASER sequence is proposed in V. O. Boer et al., NMR in Biomedicine 24 (9): 138-46 (2011). Said sequence consists of a two-step phase cycle of the excitation pulse (0°-180°), a two-step phase cycle of the third refocusing pulse (0°-180°), and a four-step phase cycle of the last refocusing pulse (0°-90°-180°-270°). This scheme cannot be shortened or modified in any other respect, however.

SUMMARY OF THE INVENTION

An object of the present invention is to provide a universally valid phase rotation scheme for pulse sequences having five radio-frequency pulses, in particular an excitation pulse and four refocusing pulses.

In the method according to the invention, a first radio-frequency pulse is applied while a gradient field is simultaneously applied in a first direction, a second radio-frequency pulse and a third radio-frequency pulse are applied while a gradient field is simultaneously applied in a second direction, and a fourth radio-frequency pulse and a fifth radio-frequency pulse are applied while a gradient field is simultaneously applied in a third direction. This pulse sequence is repeated a number of times while the phases of the different radio-frequency pulses are rotated, with the third and fourth radio-frequency pulses each have the same phase. The phase of the third and fourth radio-frequency pulses may (but does not necessarily have to) also rotate in this case, e.g. between 0° and 180°, although it is important that the third and fourth radio-frequency pulses always have the same phase, e.g. both 0° or both 180°. The first, second and fifth radio-frequency pulses can then pass through any desired phase rotation scheme.

An advantage of the invention is that a generic phase rotation method is provided, i.e. arbitrarily long or short phase rotation schemes can be generated, depending on application. The phase rotation schemes known for the PRESS sequence may be used in particular for the first, second and fifth radio-frequency pulses. At the same time, however, the semi-LASER sequence, which is more favorable particularly at high field strengths, can be used with adiabatic refocusing pulses. Unwanted coherences and echoes are more effectively suppressed as a result.

The invention is based on the recognition that if the phase of the first to fifth radio-frequency pulse is in each case designated by $\Phi_n$, where n is the index number of the radio-frequency pulse, then the phase of the spin echo of interest, in other words of the authentic signal that is not to be suppressed, is specified as $$\Phi_1 - 2(\Phi_2 - \Phi_3) + 2(\Phi_5 - \Phi_4).$$

Preferably, $\Phi_1$ is the phase of the excitation pulse, while $\Phi_2$, $\Phi_3$, $\Phi_4$ and $\Phi_5$ are the phases of the four refocusing pulses of a semi-LASER SVS sequence.

If $\Phi_3$ and $\Phi_4$ are identical, then they cancel each other out in the above-cited formula, and consequently the result obtained as the phase of the spin echo is $$\Phi_1 - 2\Phi_2 + 2\Phi_5.$$

From this it follows that the first, second and fifth radio-frequency pulses can pass through any desired phase rotation scheme, for example an 8-step EXOR. The phases of the third and fourth radio-frequency pulse must simply be identical at all times and can be rotated separately and independently thereof.

According to the invention, therefore, two phase rotation schemes are preferably combined with one another: A PRESS phase rotation scheme, i.e. an arbitrary phase rotation scheme suitable or known for a PRESS sequence, is chosen for the first, second and fifth radio-frequency pulses, and a different phase rotation scheme, which may likewise be a standard scheme, for example a two-step scheme, e.g. 0°-180°, is chosen for the third and fourth radio-frequency pulses. In each of these phases, the first, second and fifth radio-frequency pulses pass through an e.g. 8-step or 16-step PRESS phase rotation scheme. The combination of these two rotation schemes leads to a phase rotation of the five pulses of a semi-LASER SVS sequence.

Preferably the first radio-frequency pulse is an excitation pulse, for example a 90° pulse. The first radio-frequency pulse can be, but is not necessarily, an adiabatic pulse.

The second, third, fourth and fifth radio-frequency pulses are preferably refocusing pulses, in particular adiabatic pulses, e.g. AFP pulses. Any desired modulation scheme, a hyperbolic secant for example, may be used for the adiabatic pulses used.

The pulse sequence is therefore preferably a LASER or semi-LASER sequence.

The three directions of the three gradient fields are ideally at least approximately orthogonal to one another in order to enable the selection of a cuboid-shaped voxel. In addition to the slice-selective gradient fields applied simultaneously with the radio-frequency pulses, spoiler gradient fields may also be provided within the pulse sequence in order to reduce signals from outside of the selected voxel even further.

Preferably the third and fourth radio-frequency pulses are rotated through at least two phases, for example through two, three or four phases, wherein for each phase of the third and fourth radio-frequency pulse the first, second and fifth radio-frequency pulses each pass through a phase rotation, in particular a phase rotation scheme suitable for a PRESS sequence.

Preferably the receiver phase is co-rotated also. Preferably it is aligned to the phases of the first, second and fifth radio-frequency pulses at the time of each signal acquisition.

According to different embodiment variants, for each phase of the third and fourth radio-frequency pulses the first, second and fifth radio-frequency pulses can pass through a phase rotation according to 8-step EXOR, 16-step EXOR or EXORCYCLE or CYCLOPS.

According to one embodiment variant, e.g. a 32-step phase rotation scheme can be constructed by using a first pass through the EXOR 16-step scheme for the excitation pulse and the second and fifth radio-frequency pulses, where $\Phi_3 = \Phi_4 = 0$, and then a second EXOR pass where $\Phi_3 = \Phi_4 = 180°$. $\Phi_3$ and $\Phi_4$ may also assume just one value, or else two arbitrary other values different from one another, e.g. 90° and 135°, or 22.5° and 45°.

Preferably the acquired signals are subjected to a Fourier transform before or after the summation in order to generate a spectrum. This spectrum can be post-processed in accordance with known methods, e.g. filtered, smoothed, phase-corrected and displayed on a screen.

The method according to the invention is preferably used for 1H magnetic resonance spectroscopy, though it is also suitable for any other nuclei, such as 13C NMR. The method is preferably used in vivo; the examination subject is therefore preferably a part of the human or animal body, the brain for example.

During or prior to the pulse sequence according to the invention, known water or fat suppression sequences can preferably be activated in order to suppress the dominant water and fat peaks in the spectrum so that the metabolites in the tissue are rendered visible.

The invention also concerns a magnetic resonance system configured to implement the method according to the invention. For this purpose, the magnetic resonance system has at least one gradient coil for generating a gradient field, at least one radio-frequency coil for generating radio-frequency pulses, and a control device, for example a console, a computer or a workstation, by means of which the gradient coil and the radio-frequency coil can be operated using a suitable sequence protocol in order to execute the pulse sequence. The magnetic resonance system preferably has other components, such as an ADC (analog-to-digital converter), which is connected to the signal-receiving radio-frequency coil, suitable frequency generators and amplifiers for generating radio-frequency pulses, drivers for the gradient coils, as well as, of course, a main magnet. These components need not be described in further detail herein, because they are generally present in magnetic resonance systems and are well-known to those skilled in the art.

DESCRIPTION OF THE PREFERRED EMBODIMENTS

Figure 1:
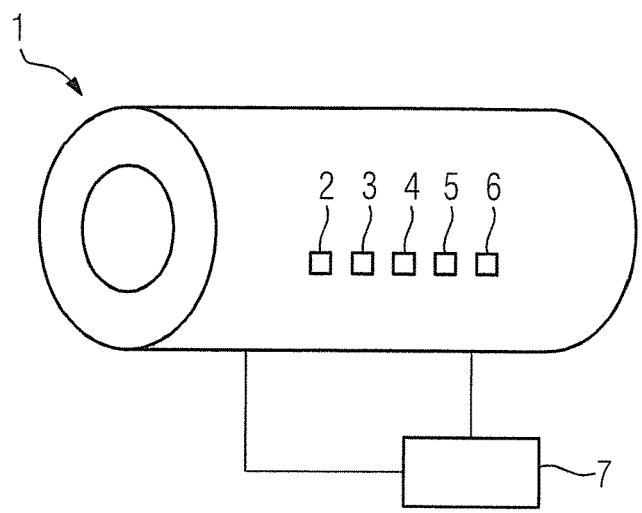
FIG. 1 shows a magnetic resonance system.

FIG. 1 schematically depicts a magnetic resonance system 1 having three gradient coils 2, 3 and 4, two radio-frequency coils 5 and 6, and a control computer 7. For clarity, other components of the magnetic resonance system 1, such as the patient table, are not shown. In this arrangement the radio-frequency coil 5 is embodied as an excitation coil, and the radio-frequency coil 6 as a detection (reception) coil. In this case the radio-frequency coil 6 is usually tailored to fit specific sections of the examination subject, e.g. as a head coil, chest coil or knee coil. The excitation coil 5 is also known as a "body coil" and is less sensitive than the radio-frequency coil 6, but is homogeneous over a greater range. This partitioning of the radio-frequency coils 5, 6 is typical (but not mandatory for the invention) for magnetic resonance systems 1 in the medical field, though not in the case of devices having bores in the range from several to approx. 30 cm, where the same radio-frequency coil is often used for both excitation and detection. Whether the excitation coil is simultaneously the detection coil is immaterial for the purposes of the invention and more or less device-dependent.

The gradient coils 2, 3 and 4 generate gradient fields in directions oriented orthogonally to one another. In order to generate a resulting gradient in a specified direction, in particular the slice direction in the case of the invention, for the first, the second and third, and the fourth and fifth RF pulses, the gradient fields of two gradient coils or of all three gradient coils 2, 3 and 4 can also be superimposed. A gradient field is therefore identical with the gradient field of a single gradient coil only in exceptional cases, while in most cases it is an overlay composed of a plurality of gradient fields.

The described method is realized in the form of software in the control computer 7. The control computer 7 is preferably part of an overall computer system, or is a mobile computer or a workstation or console acting as a control device for the magnetic resonance system 1. In particular the control computer 7 can have a data memory and a processor, in particular a CPU. The described method can be stored in the form of software on a digital data medium, for example an optical data medium, a USB stick or a hard disk.

The method according to the invention is preferably carried out automatically following positioning of the patient, after a user has selected an appropriate voxel within the body of the patient.

Figure 2:
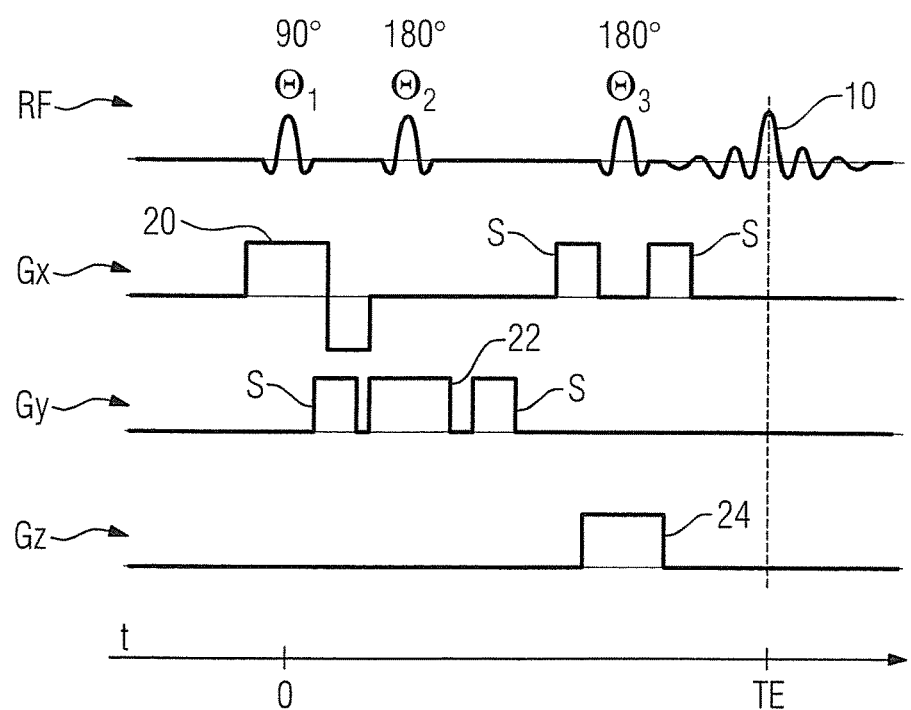
FIG. 2 shows a sequence diagram of a PRESS sequence.

FIG. 2 shows a sequence diagram intended to explain the known PRESS sequence. In this case, a 90° pulse with phase $\Theta_1$ and a gradient field 20 are initially applied simultaneously in the x-direction. A slice through the examination region is excited as a result. The magnetization generated in this way is refocused by a slice-selective 180° pulse with phase $\Theta_2$, a gradient 22 being applied simultaneously in the y-direction, in any case orthogonally to the first slice-selective gradient. The thus resulting echo is again refocused by means of a second 180° pulse with phase $\Theta_3$, a gradient now being applied in the z-direction. Spoiler gradients S are applied before and after each 180° pulse in order to dephase the magnetization outside of the voxel of interest which is produced as a result of the overlapping of the three excited slices. A further echo 10 is then generated at time point TE. This wanted echo is acquired by switching on the receiver or the receiver ADC, once again with a specific phase.

It can be shown that the phase of the wanted signal, in other words the echo from the three pulses, has the phase $\Theta_1 - 2\Theta_2 + 2\Theta_3$.

Figure 3:
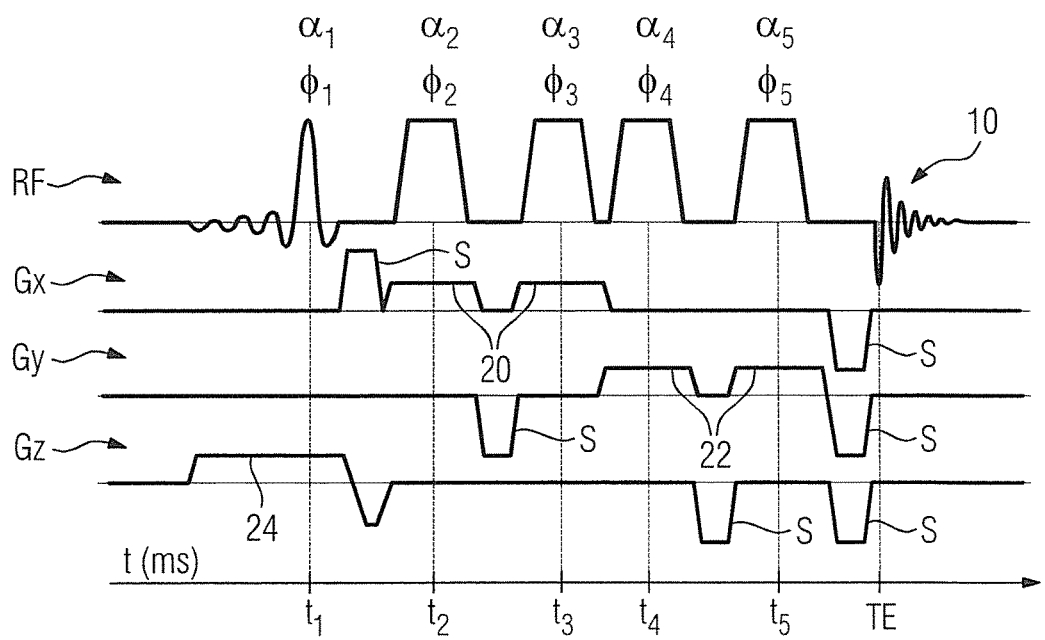
FIG. 3 shows a sequence diagram of a semi-LASER sequence.

FIG. 3 shows a sequence diagram of a semi-LASER sequence 12, which is an extension of the PRESS sequence using adiabatic pulses. In this case a normal excitation pulse $\alpha_1$ with phase $\Phi_1$ is emitted at time point $t_1$, while a gradient field 24 is simultaneously applied in the z-direction. Since the magnetization generated by means of the RF pulse starts to dephase in the x-y plane due to the z gradient, the z gradient is subsequently reversed in order to rephase the spins once more. At the same time a spoiler gradient S is applied in the x-direction. An adiabatic pulse, preferably an AFP pulse $\alpha_2$ with phase $\Phi_2$, is emitted at time point $t_2$. A gradient field 20 is simultaneously applied in the x-direction. This is followed by a further AFP pulse $\alpha_3$ with phase $\Phi_3$, which is likewise emitted while a gradient 20 is applied in the x-direction. A slice selection is therefore performed in the x-direction by means of said two RF pulses $\alpha_2$ and $\alpha_3$. A spoiler gradient S is inserted between the two pulses. Two adiabatic refocusing pulses $\alpha_4$ and $\alpha_5$, with phases $\Phi_4$ and $\Phi_5$, are in turn emitted at time points $t_4$ and $t_5$, respectively, while a gradient field is simultaneously applied in the y-direction. Spoiler gradients are inserted in this case too between the two RF pulses $\alpha_4$ and $\alpha_5$, as well as after the last refocusing pulse $\alpha_5$. This results at time point TE in a (wanted) echo 10, which is acquired by means of the receiver with a receiver phase $\Phi_{Rec}$.

Table 1 generically shows the phase rotation scheme according to the invention for the semi-Laser sequence shown in FIG. 3. In the table, $\Phi_{Rec}$ denotes the phase of the receiver or the analog-to-digital converter (ADC). According to Table 1, the phase angles $\Phi_1$, $\Phi_2$ and $\Phi_5$ of the excitation pulse $\alpha_1$ and of the first and fourth refocusing pulse pass through a PRESS phase rotation scheme, for example an 8-step EXOR scheme or an EXORCYCLE scheme. The phase rotation scheme can have an arbitrary number of steps, for example 4, 8, 16 or 32. In this case $\Phi_3$ and $\Phi_4$, i.e. the phases of the second and third refocusing pulse, are each identical to one another and also remain identical during the entire first pass through the PRESS phase rotation scheme, e.g. on the value $\Psi_1$. This value can be e.g. 0°, 90°, 180°, 270°, but also an odd value, such as 22.5° or 45°, for example.

Following this, the selected Press phase rotation scheme is repeated once again for the excitation pulse $\alpha_1$ and the first and fourth refocusing pulse $\alpha_2$ and $\alpha_5$, the second and third refocusing pulse having a different phase $\Psi_2$ which is nonetheless again identical for each pulse and remains identical over the entire PRESS phase rotation scheme. If $\Psi_1=0$, then $\Psi_2$ can be for example 180°, but also e.g. 22.5°, 45° or 180°. Arbitrary combinations of values for $\Psi_1$ and $\Psi_2$ are conceivable and practicable.

TABLE 1

First example of a phase rotation scheme according to the invention

| $\Phi_1$ | $\Phi_2$ | $\Phi_3$ | $\Phi_4$ | $\Phi_5$ | $\Phi_{Rec}$ |
|---|---|---|---|---|---|
| PRESS phase rotation scheme | PRESS phase rotation scheme | $\Psi_1$ | $\Psi_1$ | PRESS phase rotation scheme | $\Phi_1 - 2\Phi_2 + 2\Phi_5$ |
| | | $\Psi_1$ | $\Psi_1$ | | $\Phi_1 - 2\Phi_2 + 2\Phi_5$ |
| | | $\Psi_1$ | $\Psi_1$ | | $\Phi_1 - 2\Phi_2 + 2\Phi_5$ |
| | | $\Psi_1$ | $\Psi_1$ | | $\Phi_1 - 2\Phi_2 + 2\Phi_5$ |
| PRESS phase | PRESS phase | $\Psi_2$ | $\Psi_2$ | PRESS phase | $\Phi_1 - 2\Phi_2 + 2\Phi_5$ |
| | | $\Psi_2$ | $\Psi_2$ | | $\Phi_1 - 2\Phi_2 + 2\Phi_5$ |

TABLE 1-continued

First example of a phase rotation scheme according to the invention

| $\Phi_1$ | $\Phi_2$ | $\Phi_3$ | $\Phi_4$ | $\Phi_5$ | $\Phi_{Rec}$ |
|---|---|---|---|---|---|
| rotation scheme | rotation scheme | $\Psi_2$ $\Psi_2$ | $\Psi_2$ $\Psi_2$ | rotation scheme | $\Phi_1 - 2\Phi_2 + 2\Phi_5$ $\Phi_1 - 2\Phi_2 + 2\Phi_5$ |
| ... | ... | ... | ... | ... | ... |

Accordingly, the acquisition can be terminated and the signals acquired in each case added together. On the other hand, a further pass through the Press phase rotation scheme can still be executed using a further value $\Psi_3$ for the phases of the second and third refocusing pulse, or even a fourth pass using a further value $\Psi_4$ for the phase of the second and third refocusing pulse. The respective receiver phase $\Psi_{Rec}$ must be set in accordance with the specified shape for each acquisition so that the respective wanted signals are added together.

An actual example of a phase rotation according to the invention is shown in Table 2. Therein, the excitation pulse and the first and fourth refocusing pulses in each case pass through a 16-step EXOR scheme, while the second and third refocusing pulses are held on $\Psi_3=\Psi_4=0$. A second pass through the 16-step EXOR scheme is then executed using $\Psi_3=\Psi_4=180°$.

TABLE 2

Second example of a phase rotation scheme according to the invention

| Step No. | $\Phi_1$ | $\Phi_2$ | $\Phi_3$ | $\Phi_4$ | $\Phi_5$ | $\Phi_{Rec}$ |
|---|---|---|---|---|---|---|
| 1 | 90° | 90° | 0° | 0° | 0° | 270° |
| 2 | 90° | 180° | 0° | 0° | 180° | 90° |
| 3 | 90° | 270° | 0° | 0° | 0° | 270° |
| 4 | 90° | 0° | 0° | 0° | 180° | 90° |
| 5 | 90° | 90° | 0° | 0° | 0° | 270° |
| 6 | 90° | 180° | 0° | 0° | 180° | 90° |
| 7 | 90° | 270° | 0° | 0° | 0° | 270° |
| 8 | 90° | 0° | 0° | 0° | 180° | 90° |
| 9 | 270° | 90° | 0° | 0° | 90° | 270 |
| 10 | 270° | 180° | 0° | 0° | 270° | 90° |
| 11 | 270° | 270° | 0° | 0° | 90° | 270° |
| 12 | 270° | 0° | 0° | 0° | 270° | 90° |
| 13 | 270° | 90° | 0° | 0° | 90° | 270° |
| 14 | 270° | 180° | 0° | 0° | 270° | 90° |
| 15 | 270° | 270° | 0° | 0° | 90° | 270° |
| 16 | 270° | 0° | 0° | 0° | 270° | 90° |
| 17 | 90° | 90° | 180° | 180° | 0° | 270° |
| 18 | 90° | 90° | 180° | 180° | 180° | 90° |
| 19 | 90° | 180° | 180° | 180° | 0° | 270° |
| 20 | 90° | 270° | 180° | 180° | 180° | 90° |
| 21 | 90° | 0° | 180° | 180° | 0° | 270° |
| 22 | 90° | 90° | 180° | 180° | 180° | 90° |
| 23 | 90° | 180° | 180° | 180° | 0° | 270° |
| 24 | 90° | 270° | 180° | 180° | 180° | 90° |
| 25 | 270° | 90° | 180° | 180° | 90° | 270 |
| 26 | 270° | 180° | 180° | 180° | 270° | 90° |
| 27 | 270° | 270° | 180° | 180° | 90° | 270° |
| 28 | 270° | 0° | 180° | 180° | 270° | 90° |
| 29 | 270° | 90° | 180° | 180° | 90° | 270° |
| 30 | 270° | 180° | 180° | 180° | 270° | 90° |
| 31 | 270° | 270° | 180° | 180° | 90° | 270° |
| 32 | 270° | 0° | 180° | 180° | 270° | 90° |

The 32-step phase rotation scheme shown in Table 2 was implemented and tested in vivo using the following parameters: Repetition time=2 sec., echo time (TE)=135 msec., 128 repetitions, voxel size=20 mm×20 mm×20 mm. The adiabatic refocusing pulses were AFP pulses using hyperbolic secant modulation. This resulted in an overall measurement time of about 4 min. The measurements were carried out on a 3T scanner (MAGNETOM Skyra, Siemens Healthcare, Erlangen, Germany). The same measurement was performed with and without phase rotation.

Figure 4:
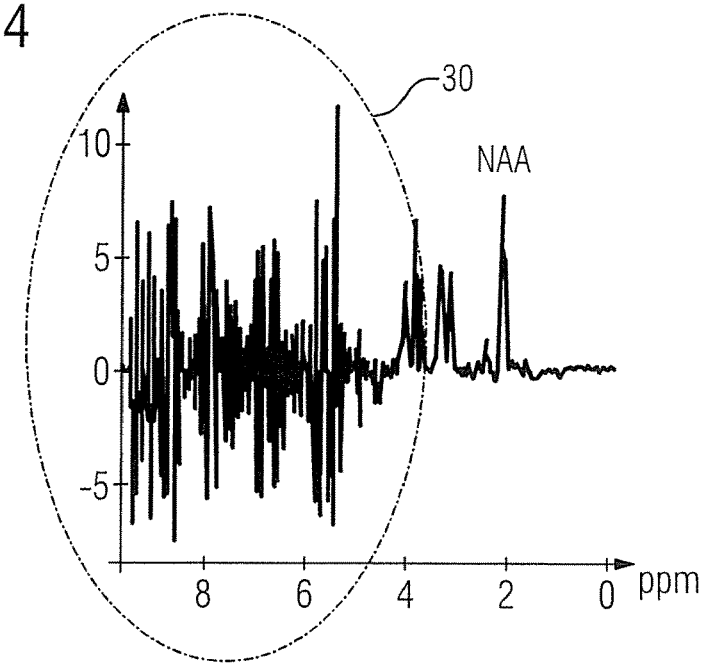
FIG. 4 shows a spectrum, acquired by means of a semi-LASER sequence, of a voxel in the frontal lobe, without phase rotation.
Figure 5:
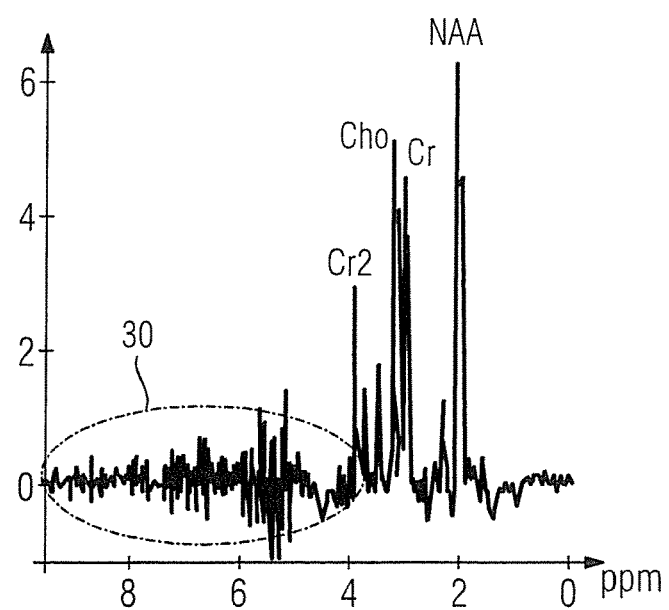
FIG. 5 shows a spectrum of the same voxel as in FIG. 4, acquired by a semi-LASER sequence using a 32-step phase rotation scheme according to the present invention.

FIGS. 4 and 5 show corresponding 1H spectra of a voxel in the frontal lobe, a region where unwanted echoes due to the high susceptibility jumps at the air-filled sinuses are a problem.

FIG. 4 shows the spectrum without phase rotation. It can be seen here that massive unwanted echoes are present above approx. 4.2 ppm in the region 30. The signal strength exceeds even that of the highest metabolite peak of NAA (N-acetylaspartate).

FIG. 5 shows the spectrum 34 of the same voxel, acquired by means of the same sequence, but using the phase rotation scheme according to the invention. It can be seen in this case that the unwanted echoes in the region 30 have been massively reduced. In contrast, the metabolites in the brain matter, in particular NAA, creatine (Cr) and choline (Cho), are now clearly visible, as also is the signal of inositol and the second peak of creatine (Cr2).

Figure 6:
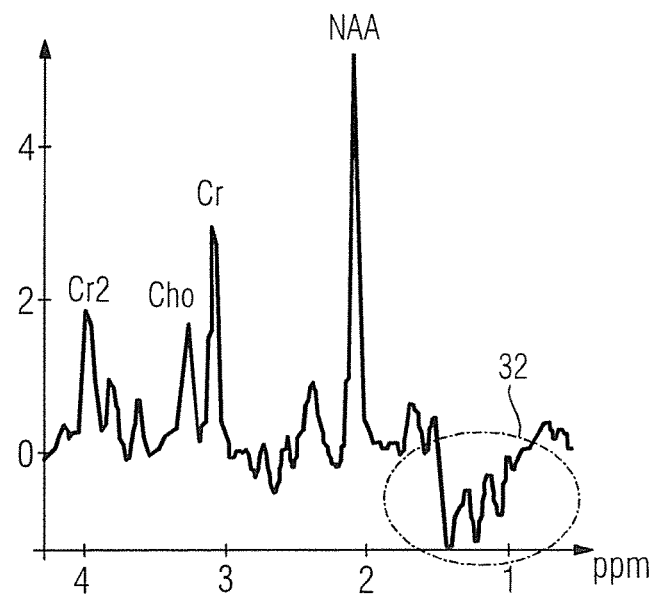
FIG. 6 shows a spectrum of a voxel in the vicinity of the cranial bone, acquired without phase rotation.

FIG. 6 shows a spectrum of a voxel in the occiput in the vicinity of the cranial bone in order to observe contamination originating from the nearby fat tissue. FIG. 6 shows the spectrum without phase rotation, with a substantial contamination being visible in the region 32 between 0.5 and 1.5 ppm.

Figure 7:
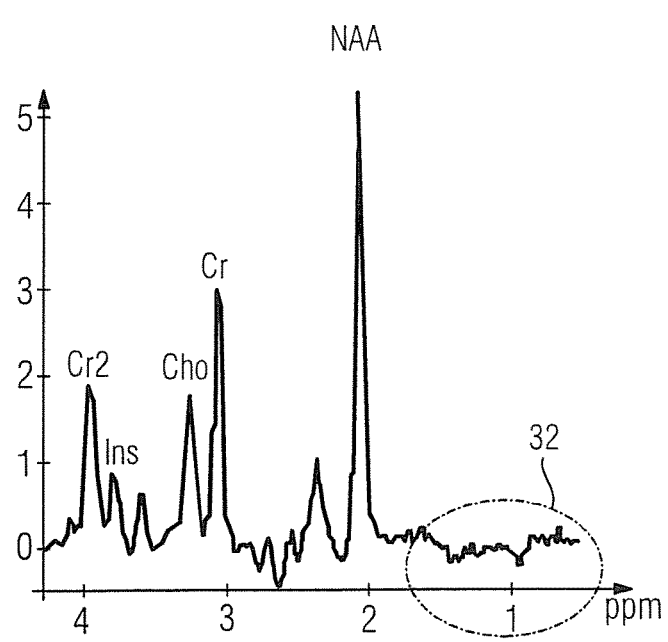
FIG. 7 shows a spectrum of the same voxel as in FIG. 6, acquired by means of a semi-LASER sequence using a 32-step phase rotation scheme.

FIG. 7, in contrast, shows the result of the measurement with phase rotation, the spectrum 34, where the contamination by lipids has been substantially reduced in the region 32.

Accordingly it was possible to demonstrate that by means of the phase rotation according to the invention two problems in connection with semi-LASER SVS can be resolved: unwanted echoes and contamination from outside of the selected voxel.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring a magnetic resonance (MR) signal from an examination subject, comprising:
    operating an MR data acquisition unit, comprising a radio-frequency (RF) transmitter and a gradient coil system and an RF receiver, according to a pulse sequence, while an examination subject is situated in the MR data acquisition unit;
    in said pulse sequence, operating said RF transmitter to radiate a first RF pulse that acts on a voxel in the examination subject, having a first phase, while simultaneously operating said gradient coil system to activate a gradient magnetic field in a first direction that also acts on said voxel;
    in said pulse sequence, operating said RF transmitter to radiate a second RF pulse that also acts on said voxel, having a second phase and to radiate a third RF pulse, having a third phase, while simultaneously operating said gradient coil system to activate a gradient magnetic field in a second direction that also acts on said voxel;
    in said pulse sequence, operating said RF transmitter to radiate a fourth RF pulse that also acts on said voxel, having a fourth phase, and a fifth RF pulse that also acts on said voxel having a fifth phase, while simultaneously operating said gradient coil system to activate a gradient magnetic field in a third direction that also acts on said voxel;

in said pulse sequence, operating said RF receiver to acquire an MR signal from voxel in said examination subject resulting from a state of excitation of nuclear spins in said voxel in the examination subject produced by a combination of said first, second, third, fourth and fifth RF pulses, and entering the acquired MR signal into an electronic memory;

operating said MR data acquisition unit by repeating said pulse sequence a plurality of times with a phase rotation of said first, second, third, fourth and fifth phases in each repetition, with said third and fourth phases being the same in each repetition, and thereby compiling a set of MR signals in said electronic memory respectively resulting from each repetition; and making said set of MR signals in said electronic memory available from said memory in electronic form as a data file for further processing thereof.

2. A method as claimed in claim 1 comprising, in said repetitions, rotating said first, second, and fifth phases according to a press phase rotation scheme selected from the group consisting of a 4-step press phase rotation scheme, and 8-step press phase rotation scheme, and 16-step press phase rotation scheme.

3. A method as claimed in claim 1 comprising rotating said third and fourth phases through at least two phases in said repetitions wherein, for each rotated phase of said third and fourth phases, said first, second and fifth phases proceed through a phase rotation.

4. A method as claimed in claim 1 comprising rotating said third and fourth phases through at least two phases in said repetitions wherein, for each rotated phase of third and fourth phases, said first, second and fifth phases proceed through a phase rotation selected from the group consisting of an 8-step EXOR, a 16-step EXOR, an EXORCYCLE, and CYCLOPS.

5. A method as claimed in claim 1 comprising, in said pulse sequence, radiating said second, third, fourth and fifth RF pulses respectively as refocusing pulses.

6. A method as claimed in claim 5 comprising, in said pulse sequence, radiating said second, third, fourth and fifth RF pulses respectively as adiabatic refocusing pulses.

7. A method as claimed in claim 1 comprising radiating said first RF pulses as an excitation pulse.

8. A method as claimed in claim 7 comprising radiating said first RF pulse as a non-adiabatic excitation pulse.

9. A method as claimed in claim 1 comprising selecting said pulse sequence from the group consisting of a LASER pulse sequence and a semi-LASER pulse sequence.

10. A method as claimed in claim 1 comprising operating said MR data acquisition unit to implement the respective phase rotation of said first, second, and fifth phases at a time of acquisition of said MR signal in each repetition.

11. A method as claimed in claim 1 comprising providing said data file to a computer and, in said computer, adding the respective MR signals in said data file together to form a sum, and Fourier transforming said sum.

12. A method as claimed in claim 1 comprising providing said data file to a computer and, in said computer, Fourier transforming each MR signal in said data file to obtain respective Fourier-transformed signals, and adding said Fourier-transformed signals together.

13. A magnetic resonance apparatus comprising:

an MR data acquisition unit comprising a radio-frequency (RF) transmitter and a gradient coil system and an RF receiver;

a control computer configured to operate said MR data acquisition unit according to a pulse sequence, while an examination subject is situated in the MR data acquisition unit;

an electronic memory;

said control computer being configured to operate said RF transmitter in said pulse sequence to radiate a first RF pulse that acts on a voxel in the examination subject, having a first phase, while simultaneously operating said gradient coil system to activate a gradient magnetic field in a first direction that also acts on said voxel;

said control computer being configured to operate said RF transmitter in said pulse sequence to radiate a second RF pulse that also acts on said voxel, having a second phase and to radiate a third RF pulse, having a third phase, while simultaneously operating said gradient coil system to activate a gradient magnetic field in a second direction that also acts on said voxel;

said control computer being configured to operate said RF transmitter in said pulse sequence to radiate a fourth RF pulse that also acts on said voxel, having a fourth phase, and a fifth RF pulse that also acts on said voxel, having a fifth phase, while simultaneously operating said gradient coil system to activate a gradient magnetic field in a third direction that also acts on said voxel;

said control computer being configured to operate said RF receiver in said pulse sequence to acquire an MR signal from said voxel in said examination subject resulting from a state of excitation of nuclear spins in said voxel in the examination subject produced by a combination of said first, second, third, fourth and fifth RF pulses, and to enter the acquired MR signal into said electronic memory;

said control computer being configured to operate said MR data acquisition unit by repeating said pulse sequence a plurality of times with a phase rotation of said first, second, third, fourth and fifth phases in each repetition, with said third and fourth phases being the same in each repetition, and thereby compile a set of MR signals in said electronic memory respectively resulting from each repetition; and said control computer being configured to make said set of MR signals in said electronic memory available from said memory in electronic form as a data file for further processing thereof.

* * * * *